(12) United States Patent
Oomori et al.

(10) Patent No.: US 11,251,051 B2
(45) Date of Patent: Feb. 15, 2022

(54) DRY ETCHING METHOD

(71) Applicant: Central Glass Company, Limited, Ube (JP)

(72) Inventors: Hiroyuki Oomori, Ube (JP); Shoi Suzuki, Ube (JP)

(73) Assignee: Central Glass Company, Limited, Ube (JP)

(*) Notice: Subject to any disclaimer, the term of this patent is extended or adjusted under 35 U.S.C. 154(b) by 0 days.

(21) Appl. No.: 17/284,679

(22) PCT Filed: Oct. 16, 2019

(86) PCT No.: PCT/JP2019/040539
§ 371 (c)(1),
(2) Date: Apr. 12, 2021

(87) PCT Pub. No.: WO2020/090451
PCT Pub. Date: May 7, 2020

(65) Prior Publication Data
US 2021/0358762 A1    Nov. 18, 2021

(30) Foreign Application Priority Data
Nov. 2, 2018 (JP) .............................. JP2018-207309

(51) Int. Cl.
*H01L 21/311* (2006.01)
*H01L 21/02* (2006.01)
*H01L 21/3065* (2006.01)

(52) U.S. Cl.
CPC ............ *H01L 21/31116* (2013.01); *H01L 21/0212* (2013.01); *H01L 21/3065* (2013.01); *H01L 21/31144* (2013.01)

(58) Field of Classification Search
None
See application file for complete search history.

(56) References Cited

U.S. PATENT DOCUMENTS

| 6,074,959 | A  | 7/2000 | Wang et al. |
| 6,183,655 | B1 | 2/2001 | Wang et al. |

(Continued)

FOREIGN PATENT DOCUMENTS

| JP | 11-330046 A  | 11/1999 |
| JP | 2001-517868 A | 10/2001 |

(Continued)

OTHER PUBLICATIONS

International Search Report (PCT/ISA/210) issued in PCT Application No. PCT/JP2019/040539 dated Dec. 24, 2019 with English translation (five (5) pages).

(Continued)

*Primary Examiner* — Allan W. Olsen
(74) *Attorney, Agent, or Firm* — Crowell & Moring LLP

(57) ABSTRACT

A dry etching method according to the present disclosure is for forming a through hole in a laminated film of silicon oxide layers and silicon nitride layers on a substrate in a direction vertical to the laminated film by plasmatizing a dry etching agent to generate a plasma and etching the laminated film by the plasma through a mask having a predetermined opening pattern under a negative direct-current self-bias voltage whose absolute value is 500 V or greater, wherein the dry etching agent contains at least $C_3F_6$, a hydrogen-containing saturated fluorocarbon represented by $C_xH_yF_z$ and an oxidizing gas, and wherein the volume of the hydrogen-containing saturated fluorocarbon contained in the dry etching agent is in a range of 0.1 to 10 times the volume of $C_3F_6$ contained in the dry etching agent.

21 Claims, 3 Drawing Sheets

(56) References Cited

U.S. PATENT DOCUMENTS

| | | | |
|---|---|---|---|
| 10,847,374 B2 * | 11/2020 | Belau | ................ H01L 21/31144 |
| 2001/0041450 A1 | 11/2001 | Matsumoto et al. | |
| 2018/0204728 A1 | 7/2018 | Oomori et al. | |

FOREIGN PATENT DOCUMENTS

| | | | | |
|---|---|---|---|---|
| JP | 2003-86568 A | | 3/2003 | |
| JP | 2003-298049 | | 10/2003 | |
| JP | 2011-124239 A | | 6/2011 | |
| JP | 2017-50529 A | | 3/2017 | |
| JP | 2017050529 A | * | 3/2017 | ........ H01L 21/31116 |
| JP | 2017-92357 A | | 5/2017 | |

OTHER PUBLICATIONS

Japanese-language Written Opinion (PCT/ISA/237) issued in PCT Application No. PCT/JP2019/040539 dated Dec. 24, 2019 (three (3) pages).

* cited by examiner

DRY ETCHING METHOD

FIELD OF THE INVENTION

The present disclosure relates to a dry etching method using a dry etching agent that contains a fluorine-containing unsaturated hydrocarbon.

BACKGROUND ART

In the manufacturing of semiconductor devices, fine processing is nowadays approaching physical limits. In order to compensate for such limits, there has been developed a technique to integrate semiconductor devices by stacking structural elements in height directions. This integration tendency is particularly notable in NAND flash memories. The research and development of three-dimensional NAND flash memories are being actively pursued.

For example, a three-dimensional NAND flash memory is known including: a substrate; a laminated film having a plurality of polycrystalline silicon (referred to as poly-Si or p-Si) layers and silicon oxide (referred to as $SiO_x$) layers alternately laminated on the substrate; and an electrode element embedded vertically in the laminated film. In the case of producing this known type of device, however, damage is caused to the substrate during the process of etching the laminated film because both of the substrate and the layers included in the laminated film are of Si. It has been difficult to etch only the laminated film of p-Si layers and $SiO_x$ layers.

Hence, proposed is a NAND flash memory using a laminated film of silicon nitride (referred to as SiN) layers and $SiO_x$ layers in place of the laminated film of p-Si layers and $SiO_x$ layers. In one exemplary production method of this proposed memory device, an alternately laminated film of SiN layers 1 and $SiO_x$ layers 2 is applied in advance onto a substrate 4 as shown in FIG. 1(*a*). Then, a through hole 5 is formed vertically in the laminated film by etching as shown in FIG. 1(*b*). After that, the SiN layers are removed to provide a gate structure although not shown in a figure.

As to the process of forming the through hole vertically through the respective layers of the laminated film, studies are being conducted on the etching of an alternately laminated film of SiN layers and $SiO_2$ layers by alternately repeating SiN etching operation and $SiO_2$ etching operation as separate process steps.

In the case of performing separate etching operations on the respective layers, however, the number of process steps significantly increases with the increasing number of layers laminated. Further, the rate of etching SiN by only a conventional CF gas is slow so that it is not possible in some cases to obtain a desired etching shape due to the occurrence of deposition on the SiN layers. There is thus sometimes used an etching method of a laminated film of at least one silicon oxide layer and at least one silicon nitride layer, in which the different kinds of layers are simultaneously etched in one plasma etching operation by the use of a mixed gas containing a CF gas and a CHF gas as disclosed in Patent Document 1.

Furthermore, Patent Document 2 discloses a dry etching method for forming a through hole in a laminated film of silicon oxide layers and silicon nitride layers on a substrate in a direction vertical to the respective layers by plasmatizing a dry etching agent and etching the laminated film by the thus-generated plasma under a bias voltage of 500 V or higher, wherein the dry etching agent contains HFO-1234ze (E), an unsaturated perfluorocarbon represented by $C_xF_y$ (where x is an integer of 2 to 5; y is 2, 4, 6, 8 or 10; and x and y satisfy y≤2x) and an oxidizing gas, and wherein the volume of the unsaturated perfluorocarbon contained in the dry etching agent is in the range of 0.1 to 10 times the volume of $C_3H_2F_4$ contained in the dry etching agent.

Patent Document 3 discloses a dry etching method for selectively etching silicon oxide against silicon nitride by plasmatization of a mixed gas of hexafluoropropene and difluoromethane.

Patent Document 4 discloses a dry etching method for etching a silicon-based material such as silicon oxide or silicon nitride by plasmatization of a dry etching gas containing hexafluoropropene and oxygen gas.

PRIOR ART DOCUMENTS

Patent Documents

Patent Document 1: Japanese Laid-Open Patent Publication No. 2003-86568
Patent Document 2: Japanese Laid-Open Patent Publication No. 2017-50529
Patent Document 3: Japanese Translation of PCT International Publication No. 2001-517868
Patent Document 4: Japanese Laid-Open Patent Publication No. 2017-92357

SUMMARY OF THE INVENTION

As mentioned above, Patent Document 1 discloses the method of simultaneously etching the different kinds of layers of the laminated film in one plasma etching operation by the mixed gas containing the CF gas such as $C_4F_8$ and the hydrogen-containing CHF gas. In this method, a resist provided on the laminated film is utilized as a mask. However, the method disclosed in Patent Document 1 fails to show sufficient etching selectivity to the mask and thus has a problem that, when the laminated film is large in thickness, the mask does not last until the completion of the etching operation. The method disclosed in Patent Document 1 also has a problem of anomaly in etching shape, such as bowing, being caused due to the insufficient formation of a side wall protecting film during the etching operation. Especially when the etching rate of the SiN layer is excessively high as compared to the etching rate of the $SiO_x$ layer, isotropic etching of the SiN layers proceeds in addition to anisotropic etching and becomes a cause of anomaly in etching shape.

The method as disclosed in Patent Document 3 is unable to form a through hole in a laminated film of SiN and $SiO_2$ layers because it allows selective etching of silicon oxide. Further, the method using the plasma generated from hexafluoropropene and oxygen gas as disclosed in Patent Document 4 is not suitable for formation of a through hole in a laminated film of SiN and $SiO_2$ layers because the plasma used exhibits a higher etching rate of silicon oxide than that of silicon nitride as shown in Comparative Example 1 of the present application.

On the other hand, it is described in Patent Document 2 that the use of the etching gas containing HFO-1234ze(E), the unsaturated perfluorocarbon $C_xF_y$ (where x is an integer of 2 to 5; y is 2, 4, 6, 8 or 10; and x and y satisfy y≤2x) and the oxidizing gas makes it possible to effectively control the etching rates of the SiN and $SiO_x$ layers and suppress the occurrence of anomaly in etching shape.

By the way, it is common practice in the production of ordinary semiconductor devices to lengthen etching time by about 1.1 to 2 times and thereby perform etching treatment more than necessary in order to prevent poor contact (electrical conduction) caused due to a residue of the etched layer at the bottom part of the etched hole. On the other hand, an etch stop layer is formed in advance at the hole bottom part in order to prevent excessive etching. The same goes for the production of devices with so-called 3D NAND structures. In other words, it is necessary, even in the above-mentioned laminated film etching method where the etching process takes place with a high aspect ratio over a depth of several μm, to stop excessive etching by forming an etch stop layer of about several nm to several tens nm at the hole bottom part, that is, the bottom part of the through hole.

The material of the etch stop layer is varied depending on the preceding and subsequent process steps and the overall device structure and is not determined definitely. In many cases, monocrystalline Si, polycrystalline Si (p-Si), W, WSi, Ti, TiN, TiOx or the like is used as the material of the etch stop layer.

The present inventors have tried the method disclosed in Patent Document 2 and resultantly found that: the method disclosed in Patent Document 2 enables high-aspect-ratio etching without causing anomaly in etching shape, but causes excessive deposition of a fluorocarbon film on the etch stop layer; and the deposited fluorocarbon film remains as an etching residue which can result in poor contact at the hole bottom part.

In the case where the hole is shallow with an aspect ratio of the order of 10, the fluorocarbon film on the etch stop layer is removed by ashing or heating treatment after the etching process. In the case where the hole is deep with an aspect ratio of 20 or higher, however, it is assumed that the fluorocarbon film on the etch stop layer might remain without being effectively removed.

In view of these circumstances, there has been a demand for an etching method capable of etching with a high aspect ratio of 20 or higher without causing anomaly in etching shape and without causing excessive deposition on an etch stop layer.

The present disclosure has been made in view of the above problems. It is an object of the present disclosure to provide an etching method capable of freely controlling a value of dividing an etching rate of SiN by an etching rate of $SiO_x$ (referred to as a $SiN/SiO_x$ etching rate ratio) within the range of 0.90 to 1.5 and causing no etching residue.

As a result of extensive researches made to achieve the above object, the present inventors have found that, in a process of forming a through hole vertically in an etching target film in which a plurality of SiN and $SiO_x$ layers are alternately laminated together on a substrate, the adoption of plasma etching using a dry etching agent which contains at least $C_3F_6$ and a hydrogen-containing saturated fluorocarbon of 1 to 4 carbons at a predetermined ratio makes it possible to freely control a value of dividing an etching rate of SiN by an etching rate of $SiO_x$ ($SiN/SiO_x$ etching rate ratio) within the range of 0.90 to 1.5 and possible to suppress excessive deposition on an etch stop layer while ensuring selectivity to the etch stop layer. The present disclosure is based on this finding.

Accordingly, the present disclosure is directed to a dry etching method for a laminated film of silicon oxide layers and silicon nitride layers on a substrate, comprising plasmatizing a dry etching agent to generate a plasma and etching the laminated film by the plasma through a mask having a predetermined opening pattern under a negative direct-current self-bias voltage whose absolute value is 500 V or greater, thereby forming a through hole in the laminated film in a direction vertical to the laminated film, wherein the dry etching agent comprises at least $C_3F_6$, a hydrogen-containing saturated fluorocarbon represented by $C_xH_yF_z$ (where x is an integer of 1 to 4; y is an integer greater than or equal to 1 and smaller than or equal to 2x+1; and z is an integer represented by 2x+2−y) and an oxidizing gas, and wherein the volume of the hydrogen-containing saturated fluorocarbon contained in the dry etching agent is in a range of 0.1 to 10 times the volume of $C_3F_6$ contained in the dry etching agent.

DETAILED DESCRIPTION OF THE EMBODIMENTS

Hereinafter, embodiments of the present disclosure will be described below. It should be understood that: the scope of the present disclosure is not limited to the following embodiments; and various changes and modifications of the following embodiments can be made as appropriate within the range that does not impair the effects of the present disclosure.

Figure 1A:
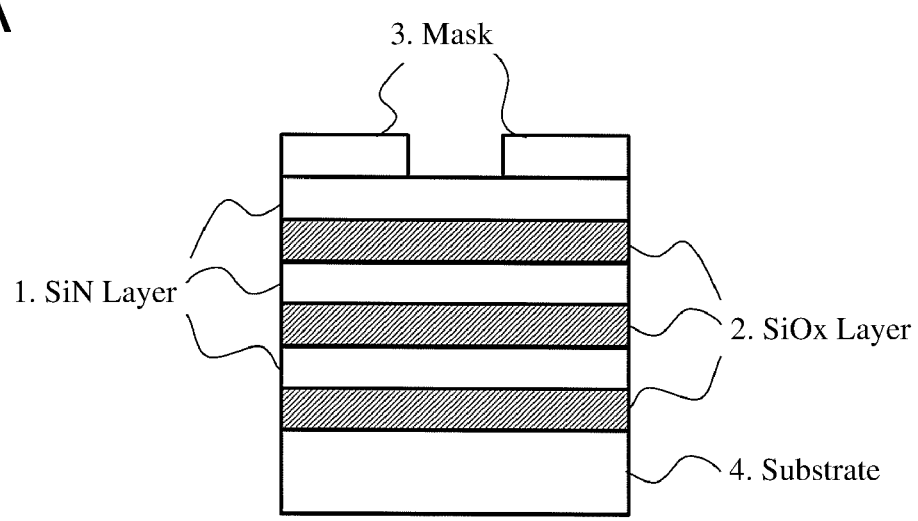
FIGS. 1A and 1B are schematic views of a laminated structure of a device before and after the formation of a through hole.
Figure 1B:
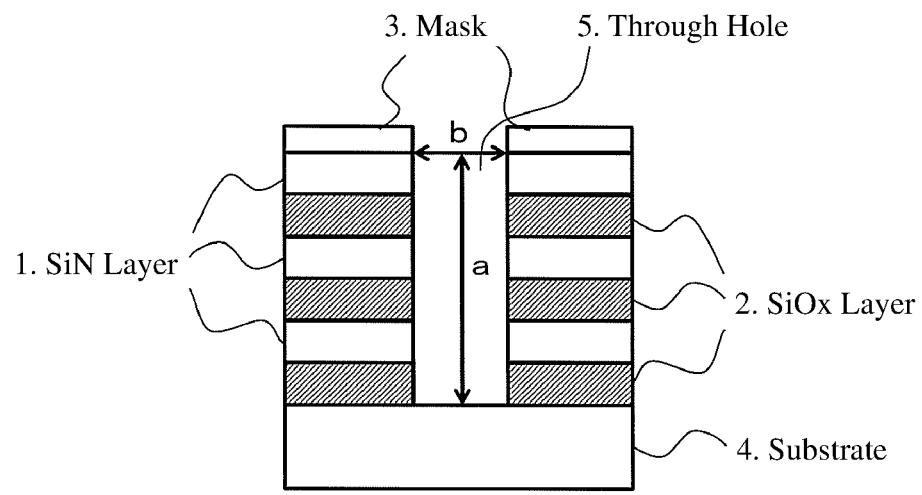

In a dry etching method embodied according to the present disclosure, an alternately laminated film of SiN layers 1 and $SiO_x$ layers 2 is provided on a substrate 4, with a mask 3 having a predetermined opening pattern applied to the laminated film, as shown in FIG. 1(a). The laminated film is etched through the mask 3, thereby forming a through hole 5 in the laminated film in a direction vertical to the laminated film, i.e., in a direction vertical to the substrate 4 as shown in FIG. 1(b). For practical use, the alternately laminated film has a laminated structure of 32 layers, 48 layers or more layers. The through hole 5 is accordingly in the form of a very narrow hole with an aspect ratio of 20 or higher. (Herein, the aspect ratio is a value of dividing a depth a of the through hole by an opening width b of the mask 3.) In $SiO_x$, x is greater than or equal to 1 and smaller than or equal to 2. $SiO_2$ is a common example of $SiO_x$. On the other hand, SiN is a compound represented by the chemical formula: $SiN_x$ (where x is greater than or equal to 0.3 and smaller than or equal to 9). $Si_3N_4$ is a common example of SiN.

The dry etching method according to the present disclosure is characterized in that the laminated film of $SiO_x$ layers and SiN layers formed on the substrate is etched by plasma etching operation using a dry etching agent containing $C_3F_6$, a hydrogen-containing saturated fluorocarbon represented by $C_xH_yF_z$ (where x is an integer greater than or equal to 1 and smaller than or equal to 4; y is an integer greater than or equal to 1 and smaller than or equal to 2x+1; and x is an integer represented by 2x+2−y) and an oxidizing gas, wherein the mixing ratio of $C_3F_6$ and the hydrogen-containing saturated fluorocarbon is in the range of 1:0.1 to 10 in terms of volume ratio. There is no particular limitation on the kind of the substrate 4 used. For example, a silicon wafer can be used as the substrate. As the material of the mask 3, amorphous carbon or a photoresist containing a photocurable resin can be used.

Examples of the hydrogen-containing saturated fluorocarbon represented by $C_xH_yF_z$ include $CHF_3$, $CH_2F_2$, $CH_3F$, $C_2HF_5$, $C_2H_2F_4$, $C_2H_3F_3$, $C_2H_4F_2$, $C_2H_5F$, $C_3HF_7$, $C_3H_2F_6$, $C_3H_3F_5$, $C_3H_4F_4$, $C_3H_5F_3$, $C_3H_6F_2$, $C_3H_7F$, $C_4H_9F$, $C_4H_8F_2$, $C_4H_7F_3$, $C_4H_6F_4$, $C_4H_5F_5$, $C_4H_4F_6$, $C_4H_3F_7$, $C_4H_2F_8$ and $C_4HF_9$.

The etching rate of the SiN layer tends to become too high as the amount of H atoms contained relative to C atoms in the hydrogen-containing saturated fluorocarbon $C_xH_yF_z$ increases. For this reason, $CHF_3$, $CH_2F_2$, $C_2HF_5$, $C_2H_2F_4$, $C_2H_3F_3$, $C_3HF_7$, $C_3H_2F_6$, $C_3H_3F_5$ and $C_3H_4F_4$ are preferred. Particularly preferred are $CH_2F_2$, $C_2H_2F_4$, $C_2H_3F_3$, $C_3HF_7$, $C_3H_2F_6$, $C_3H_3F_5$ because each of these hydrogen-containing saturated fluorocarbon compounds can be used in a reduced amount.

The fluorocarbon represented by $C_3F_6$ includes structural isomers, that is, hexafluoropropene as a linear isomer and cyclohexafluoropropane as a cyclic isomer. In the present disclosure, these structural isomers can be used solely or in the form of a mixture thereof.

An unsaturated hydrofluorocarbon such as $C_3H_2F_4$, that is, 1,3,3,3-tetrafluoropropene has an unsaturated bond in its molecule and thus undergoes polymerization in a plasma to give a polymer and form a protective film by deposition of the polymer on a side wall of the through hole. The thus-formed protective film tends to increase in thickness as the number of hydrogen atoms increases. Although the hexafluoropropene forms a protective film in the same manner as $C_3H_2F_4$, the thickness of the protective film derived from the hexafluoropropene is small as compared to the thickness of the protective film derived from $C_3H_2F_4$. This is assumed to be the reason why, in the etching method using $C_3H_6$, it is possible to suppress excessive deposition on the laminated film while ensuring selectivity to the etching stop layer.

Consideration will be now given to the case of using either of $C_4H_6$ and c-$C_4H_8$, both of which are widely utilized as etching gases, in place of $C_3H_6$.

In the case of using $C_4H_6$, an excessive protective film is likely to be formed because $C_4H_6$, which has two double bonds, is more susceptible to polymerization than $C_3H_6$ and $C_3H_2F_4$ each of which has one double bond. On this account, an oxidizing gas such as $O_2$ needs to be added at a relatively high concentration in order to carry out effective etching. It is consequently not possible to obtain sufficient selectivity to the mask.

In the case of using c-$C_4H_8$, a protective film is unlikely to be formed because c-$C_4H_8$ is low in polymerizability. Consequently, it is also not possible to obtain sufficient selectivity to the mask.

In order to attain a sufficient etching rate, the concentration of $C_3F_6$ in the dry etching agent is preferably 1 vol % or more, more preferably 5 vol % or more, relative to the total amount of flow of the dry etching agent including the after-mentioned oxidizing gas, inert gas etc. in addition to $C_3F_6$ and $C_xH_yF_z$. Further, the total concentration of $C_3F_6$ and $C_xH_yF_z$ in the dry etching agent is preferably 5 vol % or more relative to the total amount of flow of the dry etching agent. In terms of cost-effectiveness, it is not favorable that the total concentration of $C_3F_6$ and $C_xH_yF_z$ in the dry etching agent exceeds 60 vol % relative to the total amount of flow of the dry etching agent because, in such a case, it is not possible to ensure a sufficient concentration of the oxidizing gas and thereby not possible to provide an improved etching rate considering that the expensive fluorine-containing unsaturated hydrocarbon is contained in a large amount.

The mixing ratio of the fluorocarbon $C_3H_6$ and the hydrogen-containing saturated fluorocarbon $C_xH_yF_z$ is preferably 1:0.1 to 10, more preferably 1:0.2 to 5, still more preferably 1:0.4 to 3, in terms of volume ratio. When the hydrogen-containing saturated fluorocarbon $C_xH_yF_z$ is contained in too large amount, it may not be possible to obtain a desired etching shape by the occurrence of unevenness on a side wall of the through hole due to a decrease in the etching rate of the $SiO_x$ layer and a significant increase in the horizontal isotropic etching rate of the SiN layer.

In the dry etching method according to the present disclosure, it is possible to etch the laminated film of SiN and $SiO_x$ layers in one etching operation as the etching rates of the SiN and $SiO_x$ layers can be freely controlled. As the etching rates of the respective layers are equivalent to each other, it is possible to form the through hole in the laminated film with less unevenness on the side wall of the through hole and with uniformity in diameter between the upper and lower parts of the through hole.

The oxidizing gas is contained in the dry etching agent. As the oxidizing gas, there can be used $O_2$, $O_3$, $CO$, $CO_2$, $COCl_2$, $COF_2$, $NO_2$, $C_aF_bI_c$ (where a is an integer of 1 to 3; b and c are each an integer of 1 or more; a, b and c satisfy $b+c \le 2a+2$; and b+c is an even number) or the like. From the viewpoint of easy availability and ease of handling, it is preferable to use oxygen gas. The amount of the oxidizing gas contained is preferably 1 to 50 vol %, more preferably 2 to 30 vol %, still more preferably 5 to 10 vol %, based on the total amount of the dry etching agent.

Furthermore, the inert gas is preferably contained in the dry etching agent for the purpose of improving handling safety while reducing cost. As the inert gas, there can be used noble gas such gas argon gas, helium gas, neon gas, krypton gas or xenon gas, or nitrogen gas. It is particularly preferable to use argon gas from the viewpoint of easy availability and less interaction.

The dry etching agent may consist only of $C_3F_6$, the hydrogen-containing saturated fluorocarbon, the oxidizing gas and the inert gas.

In order to carry out etching with high straightness in the direction vertical to the respective layers, it is required that the absolute value of the negative direct-current self-bias voltage applied is 500 V or greater. The absolute value of the negative direct-current self-bias voltage applied is preferably 1000 V or greater. The greater the absolute value of the negative direct-current self-bias voltage applied, the less the amount of side etching. It is not favorable that the absolute value of the negative direct-current self-bias voltage applied exceeds 10000 V because, in such a case, damage to the substrate becomes increased.

It is feasible to introduce the etching gas components separately into a reaction chamber or feasible to mix the etching gas components and then introduce the resulting mixed gas into a reaction chamber. The total flow rate of the dry etching agent introduced into the reaction chamber is set as appropriate depending on the capacity of the reaction chamber and the exhaust performance of the gas exhaust system in view of the above-mentioned concentration conditions and the pressure condition.

The pressure during the etching operation is preferably 10 Pa or lower, more preferably 5 Pa or lower, still more preferably 1 Pa or lower, in order to generate a stable plasma and to improve ion straightness and suppress side etching. When the pressure inside the chamber during the etching operation becomes too low, it is not possible to obtain a sufficient plasma density due to less dissociated ions. The pressure during the etching operation is thus preferably 0.05 Pa or higher.

The temperature of the substrate during the etching operation is preferably 50° C. or lower. For anisotropic etching, the temperature of the substrate during the etching operation is particularly preferably 20° C. or lower. Under high-temperature conditions exceeding 50° C., the tendency of isotropic etching increases with decrease in the amount of the protective film formed mainly from radicals of the fluorocarbon on the side wall of the through hole so that it is not possible to obtain a required level of processing accuracy. In addition, there may occur considerable etching of the mask material such as resist under such high-temperature conditions.

The etching time is preferably 60 minutes or less in view of device manufacturing efficiency. Herein, the etching time refers to a time of reaction of the sample by plasmatization of the dry etching agent in the chamber.

There are no particular limitations on the number of the layers of the laminated film and the depth of the through hole formed in the laminated film. In order to ensure an integration effect by layer lamination, it is preferable that the total number of the layers of the laminated film is 6 or more; and the depth of the through hole is 0.5 μm or more.

The dry etching method using the dry etching agent according to the present disclosure can be executed by various etching techniques, such as capacitive coupling plasma (CCP) etching, reactive ion etching (ME), inductively coupled plasma (ICP) etching, electron cyclotron resonance (ECR) plasma etching and microwave etching, without particular limitations.

During the process of forming the through hole in the alternately laminated film of SiN layers and $SiO_x$ layers, the composition ratio of $C_3F_6$ and $C_xH_yF_z$ in the dry etching agent may be changed stepwise or periodically in the etching operation.

The etching method may include etching the laminated film without adding $C_xH_yF_z$ to the dry etching agent, namely with the use of a dry etching agent containing $C_3F_6$ and the oxidizing gas, during the process of forming the through hole.

For example, it is one embodiment to perform the etching operation by using the dry etching agent containing $C_xH_yF_z$ at the time of etching about one half of the alternately laminated film (e.g. ½ to ⅝ of the thickness of the alternately laminated film) and by using the dry etching agent containing no or a reduced amount of $C_xH_yF_z$ after etching about one half of the alternately laminated film. This method realizes high-rate etching of the alternately laminated film by adding $C_xH_yF_z$ to the dry etching agent during the initial stage of formation of the through hole where horizontal etching of SiN is unlikely to occur, and then, proceeds with etching of the alternately laminated film while suppressing horizontal etching of SiN by adding no $C_xH_yF_z$ to the dry etching agent or reducing the amount of $C_xH_yF_z$ added to the dry etching agent during the final stage of formation of the through hole where horizontal etching of SiN becomes a problem. It is accordingly possible to shorten the time required for formation of the through hole while suppressing horizontal etching of the SiN layers.

It is another embodiment to perform the etching operation by adopting the etching method according to the present disclosure at the time of etching the SiN layers of the alternately laminated film and by using the dry etching agent containing no $C_xH_yF_z$ at the time of etching the $SiO_x$ layers of the alternately laminated film. This method proceeds with etching of the SiN layers by the use of the $C_xH_yF_z$-containing dry etching agent, which shows a higher etching rate of SiN than that of $SiO_2$, during the etching of the SiN layers and lowers the etching rate of SiN and thereby suppresses horizontal etching of Si by the use of the $C_xH_yF_z$-free dry etching agent during the etching of the $SiO_x$ layers. Although it is necessary in this etching method to change the dry etching agent according to the lamination number of the SiN and $SiO_x$ layers, the dry etching agent can be changed by switching on or off the supply of $C_xH_yF_z$. As there is no need for great work to switch between the ways of etching the respective layers, the process operation is not so complicated.

In the etching method according to the present disclosure, the value of dividing the etching rate of SiN by the etching rate of $SiO_x$ (referred to as "SiN/$SiO_x$ etching rate ratio") is preferably in the range of 0.90 to 1.5, more preferably 1 to 1.3.

Further, the rate of formation of the fluorocarbon film from the dry etching agent on the substrate during the etching operation is preferably 1 nm/min or less, more preferably 0.5 nm/min or less, in the etching method according to the present disclosure.

Furthermore, the SiOx/resist etching rate ratio determined as a value of dividing the etching rate of the silicon oxide layer by the etching rate of the resist is preferably 3 or higher, more preferably 5 or higher, still more preferably 8 or higher, in the etching method according to the present disclosure.

The etching method according to the present disclosure attains high selectivity to the mask. Therefore, the etching method according to the present disclosure is suitably applicable to the formation of a through hole with an aspect ratio of over 20 in an alternately laminated film of SiN and $SiO_x$ layers during manufacturing of a three-dimensional NAND flash memory. As a consequence, it is possible to suppress excessive isotropic etching of the SiN layers exposed in the through hole of the laminated film, prevent anomaly in etching shape even during the etching operation for formation of the through hole with an aspect ratio exceeding 20 and achieve good electrical characteristics.

After the formation of the though hole in the laminated film of SiN and $SiO_x$ layers by the etching method according to the present disclosure, ashing treatment may be performed by means of a plasma generated from an oxygen-containing processing gas so as to remove a reactive product derived from the deposit of $C_xF_y$, etc. on the side wall of the through hole and to remove the mask.

EXAMPLES

The present disclosure will be described in more detail below by way of the following examples. It should be understood that the present disclosure is not limited to the following examples.

Example 1

(Etching Operation)

Figure 2:
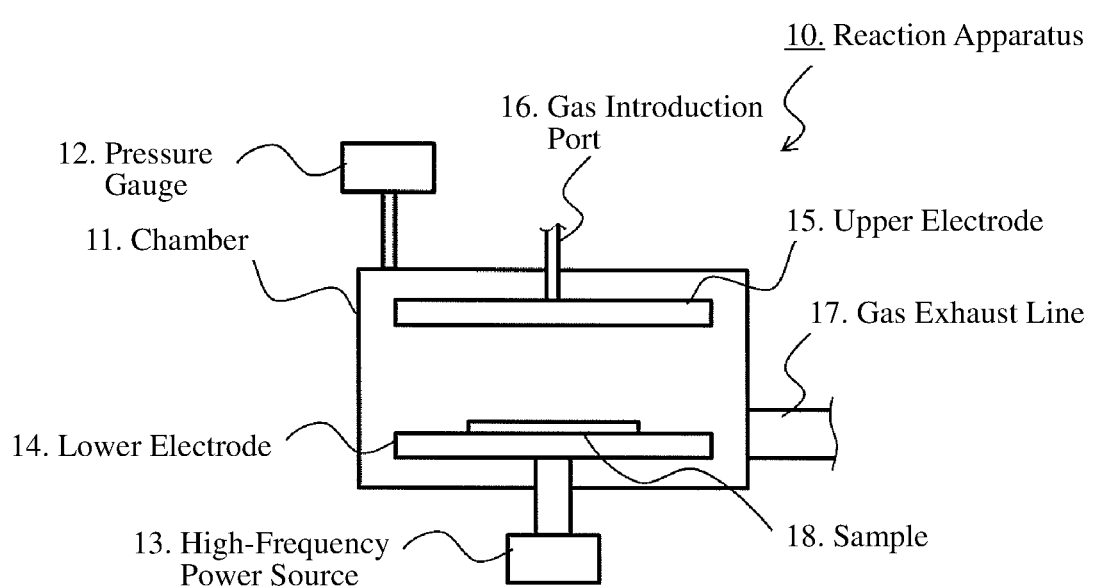
FIG. 2 is a schematic view of a reaction apparatus used in Examples and Comparative Examples.

FIG. 2 is a schematic view of a reaction apparatus 10 used in Examples and Comparative Examples. In a chamber 11, a lower electrode 14, an upper electrode 15 and a pressure gauge 12 were arranged. Herein, the lower electrode 14 had the function of holding a sample 18 and thus also served as a stage. A gas introduction port 16 was connected to an upper part of the chamber 11. The chamber 11 was configured to control its inside pressure and to plasmatize a dry etching agent by means of a high-frequency power source (13.56 MHz) 13. Accordingly, the sample 18 was etched by bringing the plasmatized dry etching agent into contact with the sample 18 on the lower electrode 14. With the application of a high-frequency power from the high-frequency power source 13 in a state that the dry etching agent was introduced into the chamber, there was developed a direct-current voltage, called a self-bias voltage, between the upper electrode 15 and the lower electrode 14 due to a difference between the drift speeds of ions and electrons in the plasma. The gas inside the chamber 11 was exhausted through a gas exhaust line 17.

As the sample 18, a silicon wafer A with a SiN layer, a silicon wafer B with a $SiO_2$ layer, a silicon wafer C with a photoresist film, a silicon wafer D with a TiN layer or a silicon wafer E with a W layer was placed on the stage. The SiN layer, the $SiO_2$ layer and the W layer were each formed by a CVD method; and the TiN layer was formed by a sputtering method.

TiN layer on the silicon wafer D and on the W layer on the silicon wafer E was also measured.

Examples 2 to 12 and Comparative Examples 1 to 6

Etching operation was performed under the same conditions as in Example 1, except that $CHF_3$, $CH_2F_2$, $CH_3F$, $C_3H_3F_5$ (1,1,1,3,3-pentafluoropropane; HFO-245fa), $C_3H_2F_4$ (HFO-1234ze(E)), $C_4F_6$ (hexafluoro-1,3-butadiene) or $CF_4$ was used as the additive gas and mixed at a ratio shown in TABLE 1.

The results of Examples and Comparative Examples are shown in TABLE 1. In TABLE 1, the etching rate ratio refers to a value of dividing the etching rate of SiN by the etching rate of $SiO_x$ ($SiN/SiO_x$ etching rate ratio); and the etching selectivity ratio refers to a value of dividing the etching ratio of the etching rate of $SiO_x$ by the etching rate of the resist film ($SiO_x$/resist etching rate ratio).

TABLE 1

| | Main Etching Gas | | Additive Gas | | Oxidizing Gas | | Inert Gas | | SiOx Etching | Sin Etching | Resist Etching | CFn Film Thickness | CFn Film Thickness | Etching Rate | Etching Selectivity |
|---|---|---|---|---|---|---|---|---|---|---|---|---|---|---|---|
| | Molecular Formula | Conc. [vol %] | Molecular Formula | Conc. [vol %] | Molecular Formula | Conc. [vol %] | Molecular Formula | Conc. [vol %] | Rate [nm/min] | Rate [nm/min] | Rate [nm/min] | (on TiN Layer) [nm] | (on W Layer) [nm] | Ratio (SiN/SiOx) | Ratio (SiOx/Resist) |
| Ex. 1 | $C_3F_6$ | 10 | $CHF_3$ | 5 | $O_2$ | 15 | Ar | 70 | 168.5 | 150.9 | 54.4 | <1 | <1 | 0.90 | 3.10 |
| Ex. 2 | $C_3F_6$ | 10 | | 10 | $O_2$ | 20 | Ar | 60 | 170.1 | 155.5 | 49.5 | <1 | <1 | 0.91 | 3.44 |
| Ex. 3 | $C_3F_6$ | 10 | | 20 | $O_2$ | 30 | Ar | 40 | 172.9 | 161.4 | 49.7 | <1 | <1 | 0.93 | 3.48 |
| Ex. 4 | $C_3F_6$ | 10 | $CH_2F_2$ | 5 | $O_2$ | 15 | Ar | 70 | 165.2 | 153.9 | 43.4 | <1 | <1 | 0.93 | 3.81 |
| Ex. 5 | $C_3F_6$ | 10 | | 10 | $O_2$ | 20 | Ar | 60 | 166.5 | 163.6 | 42.2 | <1 | <1 | 0.98 | 3.94 |
| Ex. 6 | $C_3F_6$ | 10 | | 20 | $O_2$ | 30 | Ar | 40 | 164.1 | 168.7 | 39.5 | <1 | <1 | 1.03 | 4.15 |
| Ex. 7 | $C_3F_6$ | 10 | $CH_3F$ | 5 | $O_2$ | 15 | Ar | 70 | 161.3 | 156.2 | 36.1 | 1 | 1 | 0.97 | 4.46 |
| Ex. 8 | $C_3F_6$ | 10 | | 10 | $O_2$ | 20 | Ar | 60 | 163.7 | 170.7 | 31.5 | 1 | 1 | 1.04 | 5.20 |
| Ex. 9 | $C_3F_6$ | 10 | | 20 | $O_2$ | 30 | Ar | 40 | 158.0 | 178.5 | 24.4 | 1 | 1 | 1.13 | 6.46 |
| Ex. 10 | $C_3F_6$ | 10 | $C_3H_3F_5$ | 5 | $O_2$ | 15 | Ar | 70 | 179.0 | 182.6 | 21.1 | 1 | 1 | 1.02 | 8.50 |
| Ex. 11 | $C_3F_6$ | 10 | | 10 | $O_2$ | 20 | Ar | 60 | 182.0 | 211.1 | 19.8 | 1 | 1 | 1.16 | 9.20 |
| Ex. 12 | $C_3F_6$ | 10 | | 20 | $O_2$ | 30 | Ar | 40 | 185.0 | 229.4 | 14.8 | 2 | 1 | 1.24 | 12.48 |
| Comp. Ex. 1 | $C_3F_6$ | 10 | None | | $O_2$ | 10 | Ar | 80 | 165.0 | 140.3 | 66.0 | <1 | <1 | 0.85 | 2.50 |
| Comp. Ex. 2 | $C_3F_6$ | 10 | $C_3H_2F_4$ | 10 | $O_2$ | 10 | Ar | 70 | 132.5 | 178.9 | 12.5 | 7 | 6 | 1.35 | 10.61 |
| Comp. Ex. 3 | $C_3F_6$ | 10 | | 20 | $O_2$ | 15 | Ar | 55 | 138.2 | 150.6 | 8.5 | 12 | 10 | 1.09 | 16.32 |
| Comp. Ex. 4 | $C_3F_6$ | 10 | $C_4F_6$ | 20 | $O_2$ | 10 | Ar | 60 | 115.2 | 181.2 | 48.1 | 10 | 9 | 1.57 | 2.40 |
| Comp. Ex. 5 | $C_3F_6$ | 10 | $CF_4$ | 10 | $O_2$ | 20 | Ar | 60 | 130.1 | 115.8 | 65.9 | <1 | <1 | 0.89 | 1.97 |
| Comp. Ex. 6 | $C_3F_6$ | 2 | $CH_3F$ | 40 | $O_2$ | 10 | Ar | 48 | 104.8 | 178.2 | 29.3 | 3 | 5 | 1.70 | 3.58 |

An etching agent was fed to the sample at a total flow rate of 100 sccm by mixing $C_3H_6$ (hexafluoropropene), $CHF_3$, $O_2$ and Ar at a ratio of 10 vol %, 5 vol %, 15 vol % and 70 volume % relative to the total flow rate. The etching operation was performed by plasmatization of the etching agent with the application of a high-frequency power of 400 W. In the etching operation, the pressure was 1 Pa; the power applied was 1.0 W/cm$^2$; the absolute value of the negative direct-current self-bias voltage was 1000 V; and the time was 2 minutes.

The etching rate of the SiN layer on the silicon wafer A, the etching rate of the $SiO_2$ layer on the silicon wafer B and the etching rate of the resist film on the silicon wafer C were each determined based on a difference in the thickness of the layer before and after the etching operation. Further, the thickness of fluorocarbon films ($CF_n$ films) deposited on the In each Example in which the plasma etching operation was carried out with the use of the dry etching agent containing at least $C_3H_6$ and the hydrogen-containing saturated fluorocarbon at a predetermined rate, the SiN/$SiO_x$ etching rate ratio was higher than or equal to 0.90 and lower than or equal to 1.5; and the selectivity ratio to the resist film was equivalent or superior to that in the case of no additive gas. Furthermore, the deposition of $CF_n$ films on the TiN layer and on the W layer was almost not seen. Accordingly, it was possible by this dry etching method to freely control the SiN/$SiO_x$ etching rate ratio within the range of 0.90 to 1.5 and to suppress the deposition of $CF_n$ on the etch stop layer while ensuring selectivity to the etch stop layer without causing a deterioration in the selectivity ratio to the mask.

In Comparative Example 1, by contrast, the hydrogen-containing saturated fluorocarbon was not added to the dry etching agent. Consequently, the etching rate of SiN was low so that the ratio between the etching rate of SiN and the etching rate of $SiO_x$ was 0.85 in this Comparative Example. In each of Comparative Examples 2 and 3, the unsaturated hydrofluorocarbon was used as the additive gas in the dry etching agent. In these Comparative Examples 2 and 3, the deposition of $CF_n$ films on the TiN layer and on the W layer was seen even though the ratio of the etching rate of SiN to the etching rate of $SiO_x$ was higher than or equal to 0.90 and lower than 1.5. It is assumed that such film deposition causes an adverse effect on electrical characteristics.

In each of Comparative Examples 4 and 5, the hydrogen-free saturated or unsaturated fluorocarbon was used as the additive gas in the dry etching agent. In these Comparative Examples 4 and 5, the etching rate of SiN was insufficient so that the ratio of the etching rate of SiN to the etching rate of $SiO_x$ was lower than 0.90. Moreover, the etching of the TiN and W layers proceeds in Comparative Example 5. In such a case, there is a high possibility that, depending on the etching time, the TiN and W layers do not serve as etch stop films.

In Comparative Example 6, the hydrogen-containing saturated fluorocarbon was added at a ratio exceeding 10 relative to $C_3H_6$ in the dry etching agent. The etching rate of SiN was consequently too high so that the ratio of the etching rate of SiN to the etching rate of $SiO_x$ was 1.7 in this Comparative Example 6. Further, the deposition of $CF_n$ films on the TiN layer and on the W layer was also seen in Comparative Example 6.

Figure 3A:
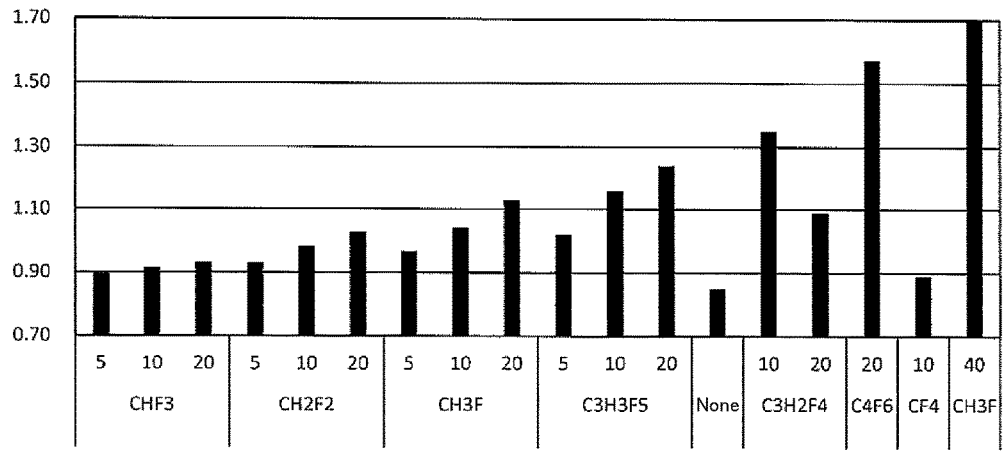
FIGS. 3A to 3C are diagrams respectively showing a $SiN/SiO_x$ etching rate ratio, an etching selectivity ratio ($SiO_x$/resist) and amounts of deposition of $CF_n$ films on metal tungsten (W) and TiN films in each of Examples and Comparative Examples.
Figure 3B:
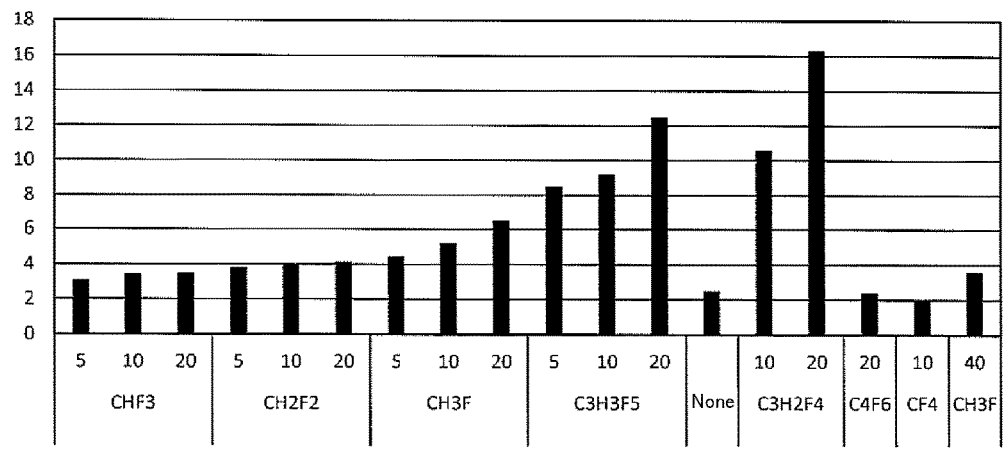
Figure 3C:
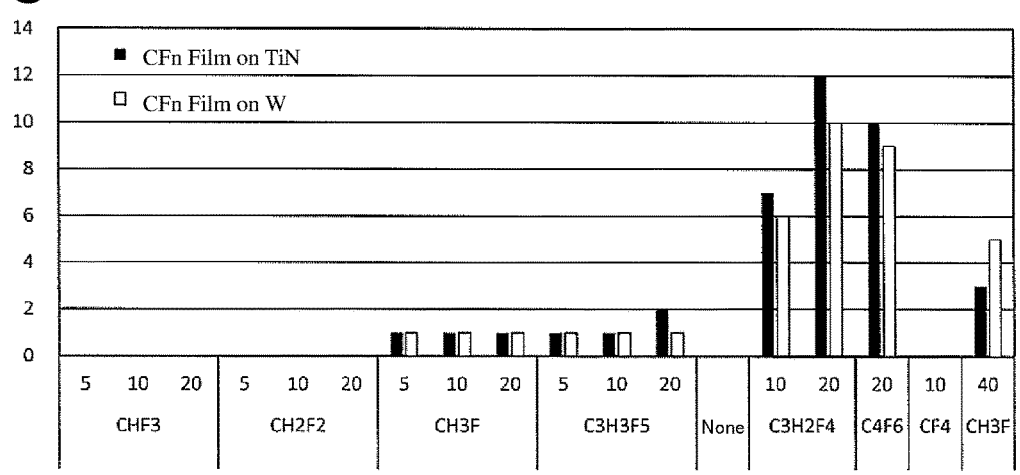

FIGS. 3(a), (b) and (c) are diagrams of the $SiN/SiO_x$ etching rate ratio, the etching selectivity ratio ($SiO_x$/resist) and the thicknesses of the $CF_n$ films deposited on the W and TiN layers in each of Examples 1 to 12 and Comparative Examples 1 to 6. As shown in FIG. 3(a), the $SiN/SiO_x$ etching rate ratio set higher by the addition of the hydrogen-containing saturated fluorocarbon such as $CHF_3$ (Examples 1 to 3), $CH_2F_2$ (Examples 4 to 6), $CH_3F$ (Examples 7 to 9) or $C_3H_3F_5$ (Examples 10 to 12) than by the addition of no additive gas (Comparative Example 1) or by the addition of the hydrogen-free saturated perfluorocarbon (Comparative Example 5). The $SiN/SiO_x$ etching rate ratio can be controlled depending on the addition amount and kind of the additive gas. As shown in FIG. 3(b), there was a tendency that the etching selectivity ratio ($SiO_x$/resist) became high with the addition of the gas having a large intramolecular hydrogen number, the gas having a large carbon number or the double bond-containing unsaturated hydrofluorocarbon ($C_3H_2F_4$ as used in Comparative Examples 2 and 3). As shown in FIG. 3(c), $CF_n$ film deposition was remarkably observed in the case of using the double bond-containing unsaturated hydrofluorocarbon (Comparative Examples 2 and 3) or using $C_4F_6$ having two double bonds (Comparative Example 4). $CF_n$ film deposition was also observed in the case of using the additive gas in an amount exceeding 10 times the amount of $C_3H_6$ used (Comparative Example 6).

As is seen from the above results, only the hydrogen-containing saturated fluorocarbon was the additive gas by which the etching operation using $C_3H_6$ was performed to show sufficient selectivity ratio to the resist, control the value of dividing the etching rate of SiN by the etching rate of SiOx ($SiN/SiO_x$ etching rate ratio) within the range of 0.9 to 1.5 and avoid remarkable $CF_n$ film deposition on the etch stop layer. It is also seen that, in Examples 10 to 12 in which $C_3F_3F_5$ was used as the additive gas, the etching selectivity ($SiO_x$/resist) was higher than or equal to 8 and was equivalent to those in Comparative Examples 2 and 3 in which $C_3H_2F_4$ was used as the additive gas.

In Comparative Example 1, the ratio of the etching rate of SiN to the etching rate of $SiO_x$ was 0.85 as the etching rate of SiN was low because of the use of only $C_3H_6$, that is, the unsaturated perfluorocarbon. It is thus assumed that, even when the etching agent of Comparative Example 1 was applied to a laminated film of SiN layers and $SiO_x$ layers, the etching rate of the SiN layers becomes so low due to the buildup of gas-derived deposits on the SiN layers that a through hole cannot be formed in the laminated film.

INDUSTRIAL APPLICABILITY

The present disclosure is useful for the formation of wirings in devices such as three-dimensionally integrated NAND flash memories during semiconductor manufacturing processes.

DESCRIPTION OF REFERENCE NUMERALS

1: SiN layer
2: $SiO_x$ layer
3: Mask
4: Substrate
5: Through hole
10: Reaction apparatus
11: Chamber
12: Pressure gauge
13: High-frequency power source
14: Lower electrode
15: Upper electrode
16: Gas introduction port
17: Gas exhaust line
18: Sample

The invention claimed is:

1. A dry etching method for a laminated film, the laminated film comprising silicon oxide layers and silicon nitride layers formed on a substrate, the dry etching method comprising plasmatizing a dry etching agent to generate a plasma and etching the laminated film by the plasma through a mask having a predetermined opening pattern under a negative direct-current self-bias voltage whose absolute value is 500 V or greater, thereby forming a through hole in the laminated film in a direction vertical to the laminated film,
wherein the dry etching agent comprises at least $C_3F_6$, a hydrogen-containing saturated fluorocarbon represented by $C_xH_yF_z$ where x is an integer of 1 to 4; y is an integer greater than or equal to 1 and smaller than or equal to 2x+1; and z is an integer represented by 2x+2−y, and an oxidizing gas, and
wherein a volume of the hydrogen-containing saturated fluorocarbon contained in the dry etching agent is in a range of 0.1 to 10 times a volume of the $C_3F_6$ contained in the dry etching agent.

2. The dry etching method according to claim 1,
wherein the hydrogen-containing saturated fluorocarbon is at least one selected from the group consisting of $CHF_3$, $CH_2F_2$, $C_2HF_5$, $C_2H_2F_4$, $C_2H_3F_3$, $C_3HF_7$, $C_3H_2F_6$, $C_3H_3F_5$ and $C_3H_4F_4$.

3. The dry etching method according to claim 1,
wherein a total concentration of the $C_3F_6$ and the hydrogen-containing saturated fluorocarbon in the dry etching agent is 5 vol % or more.

4. The dry etching method according to claim 1,
wherein the oxidizing gas is at least one selected from the group consisting of $O_2$, $O_3$, CO, $CO_2$, $COCl_2$, $COF_2$, $NO_2$ and $C_aF_bI_c$ where a is an integer of 1 to 3; b and c are each an integer of 1 or more; a, b and c satisfy b+c≤2a+2; and b+c is an even number.

5. The dry etching method according to claim 1, wherein the dry etching agent further comprises an inert gas, and
wherein the inert gas is at least one selected from the group consisting of He, Ne, Ar, Kr, Xe and $N_2$.

6. The dry etching agent according to claim 5, wherein the hydrogen-containing saturated fluorocarbon is at least one selected from the group consisting of $CHF_3$, $CH_2F_2$, $CH_3F$ and $C_3H_3F_5$,
wherein the inert gas is Ar, and
wherein the oxidizing gas is $O_2$.

7. The dry etching method according to claim 6, wherein the dry etching agent consists of the $C_3F_6$, the hydrogen-containing saturated fluorocarbon, the oxidizing gas and the inert gas.

8. The dry etching method according to claim 1, wherein the dry etching agent consists of the $C_3F_6$, the hydrogen-containing saturated fluorocarbon, the oxidizing gas and an inert gas.

9. The dry etching method according to claim 1, wherein the $C_3F_6$ is hexafluoropropene.

10. The dry etching method according to claim 1, wherein the mask is formed of amorphous carbon.

11. The dry etching method according to claim 1, wherein the through hole is formed in the laminated film by performing the etching while changing a volume ratio of the $C_3F_6$ and the hydrogen-containing saturated fluorocarbon within a range of 0.1 to 10.

12. The dry etching method according to claim 1, wherein the $C_3F_6$ is hexafluoropropene,
wherein the hydrogen-containing saturated fluorocarbon is at least one selected from the group consisting of $C_3HF_7$, $C_3H_2F_6$, $C_3H_3F_5$ and $C_3H_4F_4$, and
wherein the total concentration of the $C_3F_6$ and the hydrogen-containing saturated fluorocarbon in the dry etching agent is 5 vol % or higher.

13. The dry etching method according to claim 1, wherein the laminated film is a film in which the silicon oxide layers and the silicon nitride layers are alternately laminated together, and
wherein a total number of the silicon oxide layers and the silicon nitride layers is 6 or more.

14. The dry etching method according to claim 1, wherein a number of the layers in the laminated film is 32 is more.

15. The dry etching method according to claim 1, wherein a depth of the through hole is 0.5 µm or more.

16. The dry etching method according to claim 1, wherein the absolute value of the negative direct-current self-bias voltage is 1000 V or greater.

17. The dry etching method according to claim 1, wherein an aspect ratio determined by dividing a depth of the through hole by a width of the opening pattern is 20 or higher.

18. The dry etching method according to claim 1, wherein an $SiN/SiO_x$ etching rate ratio determined by dividing an etching rate of the silicon nitride layers by an etching rate of the silicon oxide layers is higher than or equal to 0.9 and lower than 1.5.

19. The dry etching method according to claim 1, wherein a formation rate of a fluorocarbon film derived from the dry etching agent on the substrate during the etching is 1 nm/min or lower.

20. The dry etching method according to claim 1, wherein a SiOx/resist etching rate ratio determined by dividing an etching rate of the silicon oxide layers by an etching rate of a resist is 3 or higher.

21. The dry etching method according to claim 1, wherein the hydrogen-containing saturated fluorocarbon is $C_3H_3F_5$.

* * * * *